(12) United States Patent
Cheng et al.

(10) Patent No.: US 10,395,996 B2
(45) Date of Patent: Aug. 27, 2019

(54) METHOD FOR FORMING A SEMICONDUCTOR STRUCTURE CONTAINING HIGH MOBILITY SEMICONDUCTOR CHANNEL MATERIALS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 15/494,177

(22) Filed: Apr. 21, 2017

(65) Prior Publication Data
US 2017/0221774 A1    Aug. 3, 2017

Related U.S. Application Data

(62) Division of application No. 14/741,044, filed on Jun. 16, 2015, now Pat. No. 9,633,908.

(51) Int. Cl.
*H01L 21/02* (2006.01)
*H01L 29/16* (2006.01)
(Continued)

(52) U.S. Cl.
CPC ...... *H01L 21/8258* (2013.01); *H01L 21/0242* (2013.01); *H01L 21/02381* (2013.01);
(Continued)

(58) Field of Classification Search
None
See application file for complete search history.

(56) References Cited

U.S. PATENT DOCUMENTS

| 8,384,196 B2 | 2/2013 | Cheng et al. |
| 9,437,427 B1 | 9/2016 | Balakrishnan et al. |
| (Continued) | | |

OTHER PUBLICATIONS

List of IBM Patents or Patent Applications Treated As Related, Dated Apr. 21, 2017, 2 Pages.

(Continued)

*Primary Examiner* — Reema Patel
*Assistant Examiner* — Steven M Christopher
(74) *Attorney, Agent, or Firm* — Scully, Scott, Murphy & Presser, P.C.; L. Jeffrey Kelly, Esq.

(57) ABSTRACT

A method of forming a semiconductor structure is provided. The method includes providing a substrate comprising, from bottom to top, a handle substrate, an insulator layer and a germanium-containing layer. Next, hard mask material portions having an opening that exposes a portion of the germanium-containing layer are formed on the substrate. An etch is then performed through the opening to provide an undercut region in the germanium-containing layer. A III-V compound semiconductor material is grown within the undercut region by utilizing an aspect ratio trapping growth process. Next, portions of the III-V compound semiconductor material are removed to provide III-V compound semiconductor material portions located between remaining portions of the germanium-containing layer.

18 Claims, 7 Drawing Sheets

(51) Int. Cl.
*H01L 21/8258* (2006.01)
*H01L 21/8238* (2006.01)
*H01L 21/84* (2006.01)
*H01L 27/12* (2006.01)
*H01L 29/20* (2006.01)
*H01L 29/161* (2006.01)
*H01L 21/306* (2006.01)
*H01L 21/3065* (2006.01)
*H01L 21/308* (2006.01)
*H01L 21/762* (2006.01)

(52) U.S. Cl.
CPC .. *H01L 21/02422* (2013.01); *H01L 21/02428* (2013.01); *H01L 21/02538* (2013.01); *H01L 21/02636* (2013.01); *H01L 21/02639* (2013.01); *H01L 21/02645* (2013.01); *H01L 21/02647* (2013.01); *H01L 21/3065* (2013.01); *H01L 21/3081* (2013.01); *H01L 21/30604* (2013.01); *H01L 21/30612* (2013.01); *H01L 21/76283* (2013.01); *H01L 21/823807* (2013.01); *H01L 21/823821* (2013.01); *H01L 21/823828* (2013.01); *H01L 21/84* (2013.01); *H01L 21/845* (2013.01); *H01L 27/1203* (2013.01); *H01L 27/1211* (2013.01); *H01L 29/16* (2013.01); *H01L 29/161* (2013.01); *H01L 29/20* (2013.01)

(56) References Cited

U.S. PATENT DOCUMENTS

| | | |
|---|---|---|
| 2010/0295083 A1 | 11/2010 | Celler |
| 2011/0049568 A1 | 3/2011 | Lochtefeld et al. |
| 2011/0108943 A1* | 5/2011 | Dennard ........... H01L 21/76254 257/506 |
| 2012/0074386 A1 | 3/2012 | Rachmady et al. |
| 2014/0170821 A1* | 6/2014 | Nyhus ............... H01L 29/66666 438/268 |
| 2014/0175509 A1 | 6/2014 | Chu-King et al. |
| 2014/0217467 A1* | 8/2014 | Pawlak .................. H01L 29/12 257/183 |
| 2014/0264446 A1 | 9/2014 | Basu et al. |
| 2014/0264607 A1 | 9/2014 | Basu et al. |
| 2014/0374796 A1 | 12/2014 | Adam et al. |
| 2015/0001587 A1 | 1/2015 | Yang et al. |
| 2015/0035019 A1 | 2/2015 | Song et al. |
| 2015/0099334 A1 | 4/2015 | Liu et al. |
| 2015/0108548 A1 | 4/2015 | Dunn et al. |
| 2016/0093619 A1 | 3/2016 | Cheng et al. |
| 2016/0254196 A1 | 9/2016 | Cheng et al. |

OTHER PUBLICATIONS

Notice of Allowance dated Jan. 24, 2019 received in U.S. Appl. No. 15/494,099.

* cited by examiner

METHOD FOR FORMING A SEMICONDUCTOR STRUCTURE CONTAINING HIGH MOBILITY SEMICONDUCTOR CHANNEL MATERIALS

BACKGROUND

The present application relates to semiconductor technology and more particularly to a method of forming dual channel complementary metal oxide semiconductor (CMOS) field effect transistors (i.e., FETs) on a same substrate. The present application also relates to a semiconductor structure that can be formed by the method.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Dual channel CMOS having different semiconductor channel materials is needed for 10 nm and beyond technologies. For example, III-V compound semiconductor channel materials are needed for nFET devices, while germanium-containing semiconductor channel materials are needed for pFET devices. Aspect ratio trapping (ART) is an effective way to grow semiconductor materials on a semiconductor wafer and thus can be used for providing a structure having different semiconductor materials. Conventional ART however has some drawbacks that are associated therewith. For example, conventional ART can be used in providing thin semiconductor fin structures, but it is difficult to form large planar structures.

Moreover and in conventional ART, a defect-containing semiconductor material portion of the ART grown semiconductor material remains in the structure after ART growth. The defect-containing semiconductor material portion of the ART grown semiconductor material must be isolated from the semiconductor material portion of the ART grown semiconductor material or it will cause excessive device leakage.

In view of the above, there is a need for providing dual channel CMOS having different semiconductor channel materials, e.g., a III-V compound semiconductor channel material for nFETs and a germanium-containing channel material for pFETs, that avoids the drawbacks mentioned above.

SUMMARY

In one aspect of the present application, a method of forming a semiconductor structure is provided. In one embodiment of the present application, the method includes providing a substrate comprising, from bottom to top, a handle substrate, an insulator layer and a germanium-containing layer. Next, hard mask material portions having an opening that exposes a portion of the germanium-containing layer are formed on the substrate. Etching is then performed through the opening to provide an undercut region in the germanium-containing layer. In accordance with the present application, the undercut region is located between two remaining portions of the germanium-containing layer. A III-V compound semiconductor material is grown within the undercut region and laterally outwards from sidewall surfaces of the two remaining portions of the germanium-containing layer. Next, portions of the III-V compound semiconductor material are removed to provide III-V compound semiconductor material portions located between the two remaining portions of the germanium-containing layer.

In another aspect of the present application, a semiconductor structure is provided. In one embodiment of the present application, the semiconductor structure includes a handle substrate having semiconductor back gate pedestal portions. An insulator layer portion is located on each semiconductor back gate pedestal portion. III-V compound semiconductor material portions are located on a first set of the insulator layer portions, and germanium-containing material portions are located on a second set of the insulator layer portions. A trench isolation structure is present between each III-V compound semiconductor material portion and each germanium-containing material portion.

DETAILED DESCRIPTION

Figure 1:
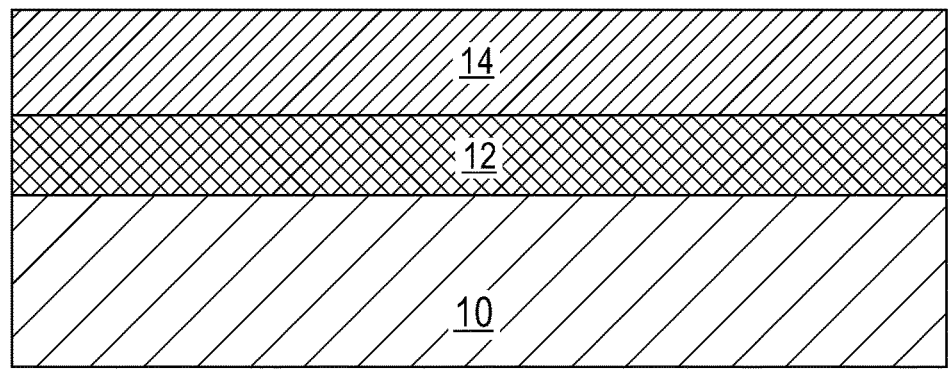
FIG. 1 is a cross sectional view of an exemplary semiconductor structure including, from bottom to top, a handle substrate, an insulator layer and a germanium-containing layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a handle substrate 10, an insulator layer 12 and a germanium-containing layer 14 that can be employed in accordance with an embodiment of the present application. Collectively, the structure including the handle substrate 10, the insulator layer 12, the germanium-containing layer 14 can be referred to herein as a germanium-containing material-on-insulator (GeOI) substrate.

In some embodiments of the present application, the handle substrate 10 may comprise a semiconductor material. The term "semiconductor" as used herein in connection with the semiconductor material of the handle substrate 10 denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 may be comprised of silicon. In some embodiments, the handle substrate 10 is a non-semiconductor material including, for example, a dielectric material and/or a conductive material.

The insulator layer 12 of the exemplary semiconductor structure shown in FIG. 1 may be a crystalline or non-crystalline oxide and/or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride. In one embodiment, the thickness of the insulator layer 12 that may be used in the present application can be from 10 nm to 200 nm. In another embodiment, the thickness of the insulator layer 12 can be from 1 nm to 20 nm. Other thicknesses that are lesser than, or greater than, the aforementioned thickness ranges for the insulator layer 12 can also be used in the present application.

The term "germanium-containing" as used throughout the present application refers to a semiconductor material that contains pure germanium (i.e., unalloyed germanium) and/or a silicon germanium alloy. Thus, germanium-containing layer 14 is selected from germanium, a silicon germanium alloy and a multilayered stack, in any order of, germanium and a silicon germanium alloy. When the germanium-containing layer 14 comprises a silicon germanium alloy, the silicon germanium alloy may be in a relaxed state. The term "relaxed" when used in conjunction with the term "silicon germanium alloy" denotes a silicon germanium alloy that has a relaxation value of 90% or greater. In one embodiment of the present application and when a silicon germanium alloy is used as the germanium-containing layer 14, the silicon germanium alloy can have an initial germanium content of from 25 atomic percent to 75 atomic percent (i.e., $Si_{1-y}Ge_y$ wherein y is from 0.25 to 0.75). Typically, and when a silicon germanium alloy is used as the germanium-containing layer 14, the silicon germanium alloy layer can have an initial germanium content from 35 atomic percent to 65 atomic percent. The silicon germanium alloy that can provide the germanium-containing layer 14 may be compositional graded or compositional ungraded.

Germanium or a silicon germanium alloy can be formed utilizing any well known deposition process including, for example, rapid thermal chemical vapor deposition (RTCVD), low-energy plasma deposition (LEPD), ultra-high vacuum chemical vapor deposition (UHVCVD), atomic pressure chemical vapor deposition (APCVD) or molecular beam epitaxy (MBE). A number of different source gases may be used for the deposition of germanium or a silicon germanium alloy. In some embodiments, the source gas for the deposition of a silicon germanium alloy material includes a mixture of a silicon containing gas source and a germanium containing gas source or a combined silicon and germanium source gas may be used. In some embodiments, the source gas for deposition of germanium may include a germanium containing source gas. Carrier gases like hydrogen, nitrogen, helium and argon can be used.

In some embodiments of the present application, the handle substrate 10 and the germanium-containing layer 14 may have a same crystal orientation. In other embodiments, the handle substrate 10 and the germanium-containing layer 14 may have different crystal orientations. The crystal orientation of the handle substrate 10 and/or the germanium-containing layer 14 may be {100}, {110}, or {111}. Other crystallographic orientations besides those specifically mentioned can also be used in the present application. The handle substrate 10 may be a single crystalline semiconductor material, a polycrystalline material, or an amorphous material. The germanium-containing layer 14 is typically single crystalline.

The thickness of the germanium-containing layer 14 may vary depending on the type of material used in providing the germanium-containing layer 14. When germanium is used as the germanium-containing layer 14, the germanium-containing layer 14 can have a thickness from 3 nm to 100 nm. Other thickness that are lesser than, or greater than, the aforementioned thickness range may also be used in providing a germanium-containing layer 14 that comprises germanium. When a silicon germanium alloy material is used in providing the germanium-containing layer 14, the thickness of the silicon germanium alloy is at, or below, the critical thickness of a silicon germanium alloy. Above the critical thickness the silicon germanium alloy that is formed is very defective and is not suitable for use as a device channel material. In one example, the thickness of the silicon germanium alloy that can be used as the germanium-containing layer 14 is from 30 nm to 100 nm. Other thicknesses that are lesser than, or greater than, the aforementioned thickness range can also be employed in the present application as long as the thickness of the silicon germanium alloy is below the limit in which defects form and as long as the resultant silicon germanium alloy is in a relaxed state.

The exemplary semiconductor structure including handle substrate 10, insulator layer 12, and germanium-containing layer 14 may be formed utilizing standard processes known in the art. In one example, the exemplary semiconductor structure shown in FIG. 1 may be formed by a layer transfer process in which wafer bonding may be used to provide the exemplary semiconductor structure shown in FIG. 1. In other embodiments, the exemplary semiconductor structure shown in FIG. 1 can be formed by thermal mixing of a silicon containing layer and a germanium containing layer that are formed over an insulator layer.

Figure 2:
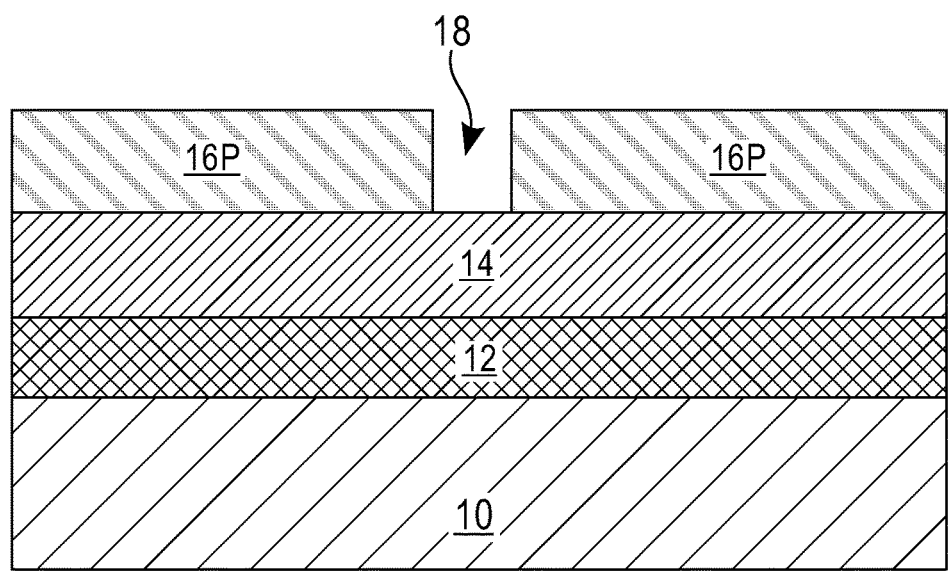
FIG. 2 is a cross sectional view of the exemplary semiconductor structure of FIG. 1 after forming hard mask material portions having an opening that exposes a portion of the germanium-containing layer.

Referring now to FIG. 2, there is illustrated the exemplary semiconductor structure of FIG. 1 after forming hard mask material portions 16P having an opening 18 that exposes a portion of the germanium-containing layer 14. Although the present application describes and illustrates the formation of a single opening 18, a plurality of such openings can be formed.

The exemplary semiconductor structure shown in FIG. 2 can be formed by first forming a hard mask layer (not shown). The hard mask layer is a contiguous layer that covers an entirety of the germanium-containing layer 14. The hard mask layer that can be employed in the present application may include a hard mask material such as, for example, a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments of the present application, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 2 nm to 10 nm, although other thickness that are lesser than, or greater than, the aforementioned thickness range can be used for the hard mask layer.

After providing the hard mask layer, lithography and etching can be used to pattern the hard mask layer and to provide opening 18 within the hard mask layer. The remaining portions of the hard mask layer constitute the hard mask material portions 16P mentioned above. Lithography includes forming a photoresist material (not shown) on a topmost surface of the hard mask layer. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the hard mask layer. The pattern provided by the patterned photoresist material is thereafter transferred into the underlying hard mask layer utilizing a pattern transfer etching process. Typically, the pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The patterned resist material can be removed after forming opening 18 utilizing any conventional resist stripping process such as, for example, ashing.

Figure 3:
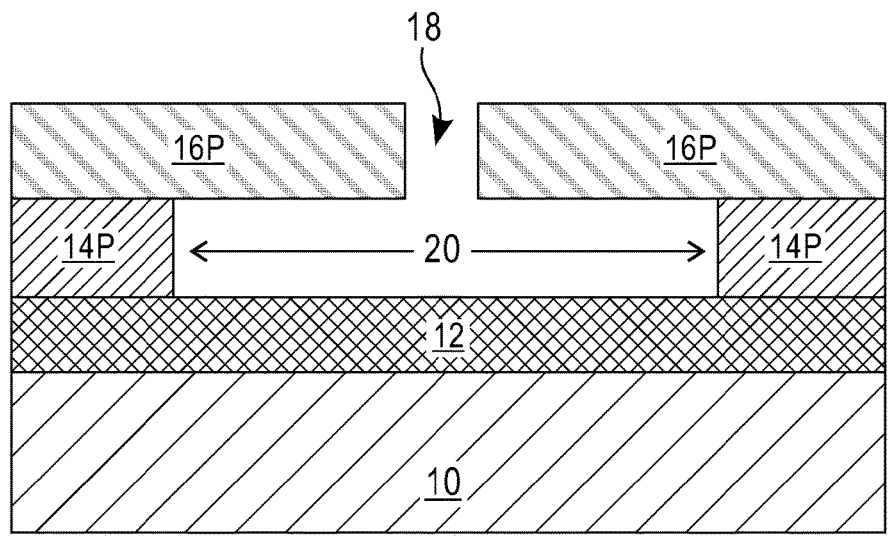
FIG. 3 is a cross sectional view of the exemplary semiconductor structure of FIG. 2 after performing an etch to provide an undercut region in the germanium-containing layer.

Referring now to FIG. 3, there is illustrated the exemplary semiconductor structure of FIG. 2 after performing an etch through opening 18 to provide an undercut region 20 in the germanium-containing layer 14. After performing the etch and as shown in FIG. 3, portions of the germanium-containing layer 14 remain. Each remaining portion of the germanium-containing layer 14 can be referred to herein as germanium-containing material portion 14P. Each remaining germanium-containing material portion 14P provides an active germanium-containing material in which a pFET can subsequently be formed. Each remaining germanium-containing material portion 14P that is provided has a width that is less than a width of an overlying hard mask material portion 16P. As such, each hard mask material portion 16P overhangs an underlying germanium-containing material portion 14P. As is shown, undercut region 20 is located between two spaced apart germanium-containing material portions 14P.

The etch that can be used in providing the undercut region 20 is a lateral etch that includes etchants that are selective in removing a germanium-containing material relative to the hard mask material that provides each hard mask material portion 16P or the dielectric material that provides insulator layer 12. In one embodiment, the etch that provides undercut region 20 may include hydrogen peroxide, i.e., $H_2O_2$. In another embodiment, the etch that provides undercut region 20 may comprise gaseous HCl.

In one embodiment, the width of the undercut region 20, as measured from one sidewall surface of one of the germanium-containing material portions 14P to one sidewall surface of another of the germanium-containing material portions 14P, can be from 50 nm to 1000 nm. Other widths that are lesser than, or greater than, the aforementioned width range may also be obtained and used in the present application. It is noted that the lower limit for the width of the undercut region 20 should be sufficient enough to trap defects within a subsequently formed III-V compound semiconductor material 22 at the bottommost surface of each overhanging hard mask material portion 16P and a topmost surface of insulator layer 12.

Figure 4:
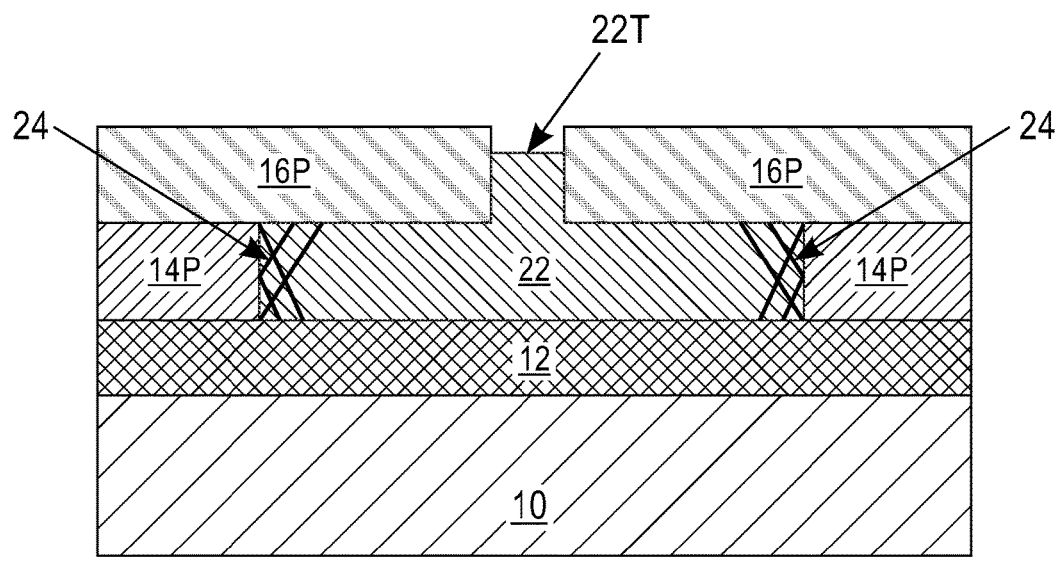
FIG. 4 is a cross sectional view of the exemplary semiconductor structure of FIG. 3 after growing a III-V compound semiconductor material within the undercut region by utilizing an aspect ratio trapping growth process.

Referring now to FIG. 4, there is illustrated the exemplary semiconductor structure of FIG. 3 after growing a III-V compound semiconductor material 22 within the undercut region 20 by utilizing an aspect ratio trapping growth process. The aspect ratio trapping growth process may be referred to herein as a lateral epitaxial semiconductor regrowth process in which a III-V compound semiconductor is grown laterally outwards from the exposed sidewall surface of each germanium-containing material portion 14P that is located within the undercut region 20. The lateral epitaxial semiconductor regrowth process that can be used in the present application is similar to the process mentioned in U.S. Patent Application Publication No. 2011/0049568 to Lochtefeld et al., the entire content and disclosure of which is incorporated herein by reference, except that lateral growth is used in the present application rather than bottom-up growth as disclosed in the aforementioned publication.

The term "III-V compound semiconductor" as used in conjunction with the III-V compound semiconductor material 22 denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors. In one embodiment of the present application, InAs, GaAs, or InP can be used as the III-V compound semiconductor material 22.

The III-V compound semiconductor material 22 includes defect-containing regions 24 that are laterally adjacent to a sidewall surface of each germanium-containing material portion 14P. In some embodiments, the III-V compound semiconductor material 22 includes an overgrowth region 22T that is located above the topmost surface of each germanium-containing material portion 14P and in contract with a sidewall surface of each hard mask material portion 16P. When present, the overgrowth region 22T comprises a same III-V compound semiconductor as the III-V compound semiconductor material 22 and typically the overgrowth region 22T has a same defect density as the III-V compound semiconductor material 22. In yet other embodiments, the overgrowth region 22T is not formed and a defect-containing region (not shown) may be present within the undercut region 20 and directly positioned beneath the opening 18. Each defective-containing region 24, which also includes a same III-V compound semiconductor as III-V compound semiconductor material 22, has a defect density that is greater than a defect density of the III-V compound semiconductor material 22 and the overgrowth region 22T. It is noted that the defect-containing region 24, the III-V compound semiconductor material 22 and the overgrowth region 22T are of unitary construction and each comprises a same III-V compound semiconductor.

Notably, and since an epitaxial semiconductor regrowth process is used in forming the III-V compound semiconductor material 22, III-V compound semiconductor material 22 has a same crystalline characteristic as the semiconductor material of the deposition surface. Thus, in the present application, III-V compound semiconductor material 22 has an epitaxial relationship, i.e., same crystal orientation, with the sidewall surfaces of each germanium-containing material portion 14P within the undercut region 20.

In some embodiments of the present application, the selected crystallographic direction of the III-V compound semiconductor material 22 is aligned with at least one propagation direction of threading dislocations in undercut region 20 in which the III-V compound semiconductor material 22 is formed. Threading dislocations in this region (i.e., defect-containing region 24) may substantially terminate at the bottommost surface of each overhanging hard mask material portion 16P and a topmost surface of the insulator layer 12.

The III-V compound semiconductor material 22 can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include III-V compound forming precursor gases and a carrier gas, such as, for example hydrogen. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

Figure 5A:
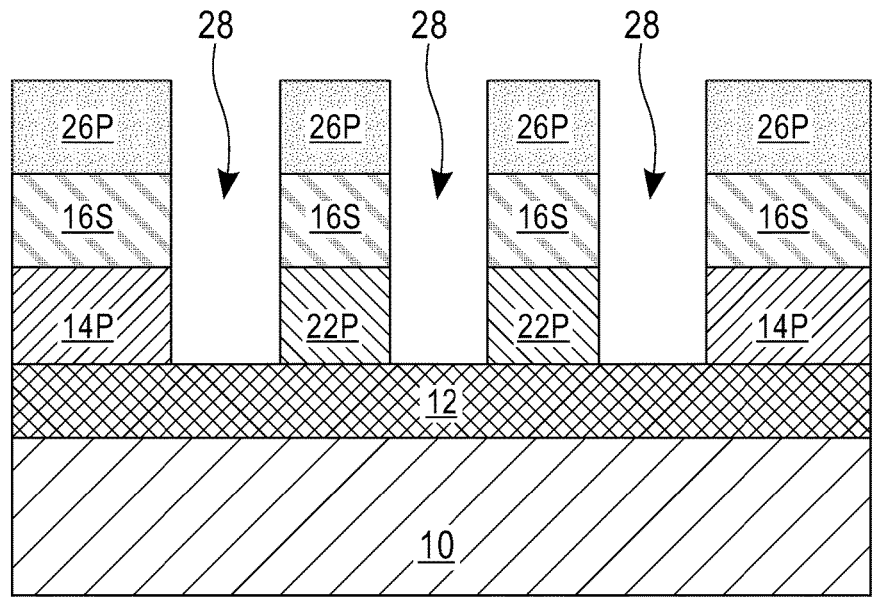
FIG. 5A is a cross sectional view of the exemplary semiconductor structure of FIG. 4 after forming trench isolation openings that extend to a topmost surface of the insulator layer in accordance with an embodiment of the present application.

Referring now to FIG. 5A, there is illustrated the exemplary semiconductor structure of FIG. 4 forming trench isolation openings 28 that extend to a topmost surface of the insulator layer 12 in accordance with an embodiment of the present application. During formation of the trench isolation openings 28, the defect-containing regions 24 and, if present, the overgrowth region 22T can be entirely removed from the exemplary semiconductor structure.

Each trench isolation opening 28 can be formed by first providing another hard mask layer (not shown) over the exposed surfaces of the exemplary semiconductor structure shown in FIG. 4. The another hard mask layer includes a different hard mask material than that used in providing the hard mask layer mentioned above that provides hard mask material portions 16P. In one example, hard mask material portions 16P may comprise silicon nitride, while the another hard mask layer may comprise silicon dioxide. The another hard mask layer can be formed utilizing one of the deposition processes mentioned above for providing the hard mask layer that is used in providing hard mask material portions 16P. The another hard mask layer can have a thickness within the thickness of the another hard mask layer mentioned above for providing hard mask material portions 16P.

Lithography and at least one etch, as defined above in forming opening 18, are then used to provide each trench isolation opening 28. After etching, portions of the another hard mask layer remain. Each remaining portion of the another hard mask layer can be referred to herein as another hard mask material portion 26P. After etching, portions of the hard mask material portions 16P remain. Each remaining hard mask material portion can now be referred to herein as a hard mask material structure 16S. After etching, portions of the III-V compound semiconductor material 22 that have the lower defect density than the defect-containing regions 24 remain. Each remaining portion of the III-V compound semiconductor material can be referred to herein as a III-V compound semiconductor material portion 22P. Each remaining III-V compound semiconductor material portion 22P provides an active III-V compound semiconductor material in which an nFET can subsequently be formed. Each III-V compound semiconductor portion 22P is positioned between remaining germanium-containing material portions 14P as shown and has a topmost surface that is coplanar with a topmost surface of each remaining germanium-containing material portion 14P.

Figure 5B:
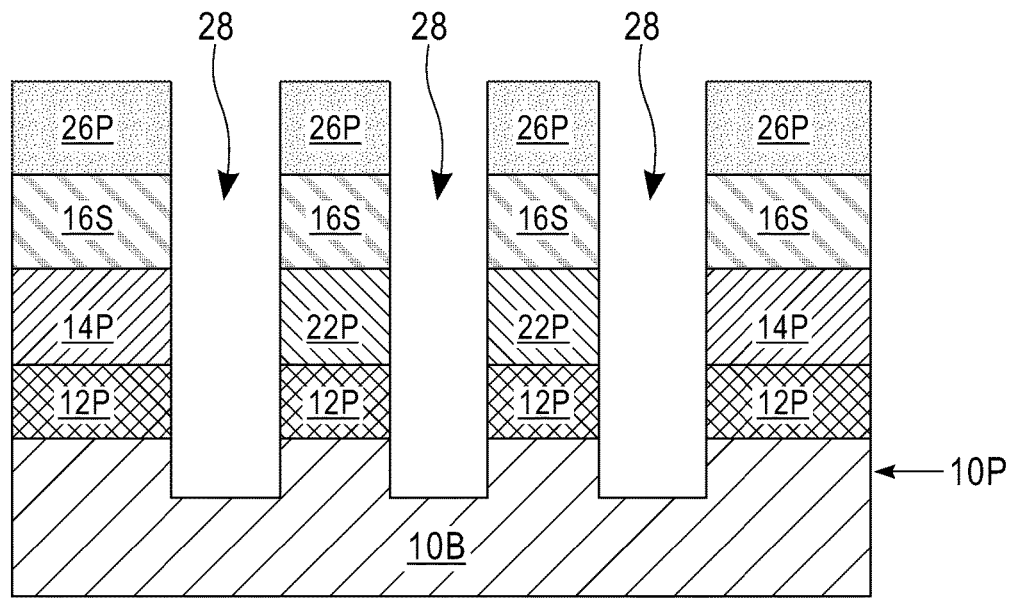
FIG. 5B is a cross sectional view of the exemplary semiconductor structure of FIG. 4 after forming trench isolation openings that extend into a portion of the handle substrate in accordance with another embodiment of the present application.

Referring now to FIG. 5B, there is illustrated the exemplary semiconductor structure of FIG. 4 after forming trench isolation openings 28 that extend into a portion of the handle substrate 10 in accordance with another embodiment of the present application. During formation of the trench isolation openings 28, the defect-containing regions 24 and, if present, the overgrowth region 22T can be entirely removed from the exemplary semiconductor structure. The trench isolation openings 28 of this embodiment can be formed utilizing the same technique as mentioned above in providing the trench isolation structures to the exemplary semiconductor structure shown in FIG. 5A. In this embodiment, the etch extends into a portion of the handle substrate 10 providing a pedestal portion 10P comprises a same material as the handle substrate which extends above a base substrate 10B that also comprises a same material as the handle substrate. The formation of the structure shown in FIG. 5B is typically performed for structures in which handle substrate 10 comprises a semiconductor material. Also, and this embodiment, the insulator layer 12 is patterned forming insulator material portions beneath each germanium-containing material portion 14P and each III-V compound semiconductor material portion 22P. The remaining insulator material located beneath each germanium-containing material portion 14P and each III-V compound semiconductor material portion 22P can be referred to as an insulator material portion 12P.

Figure 6A:
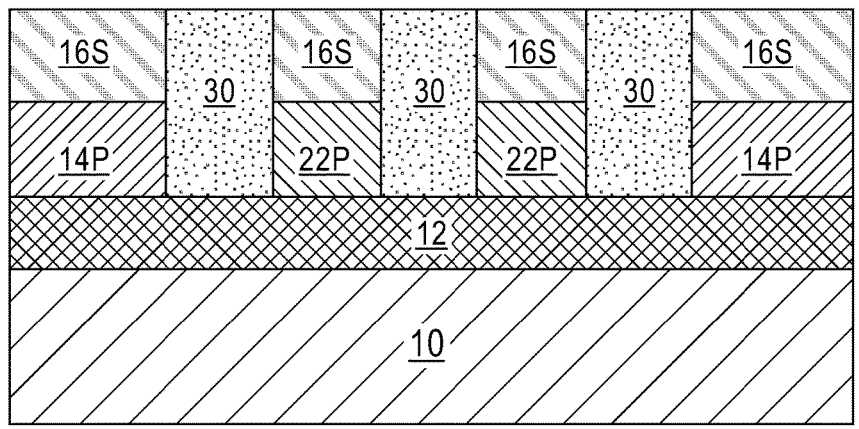
FIG. 6A is a cross sectional view of the exemplary semiconductor structure of FIG. 5A after forming a trench dielectric material plug within each trench isolation opening.
Figure 6B:
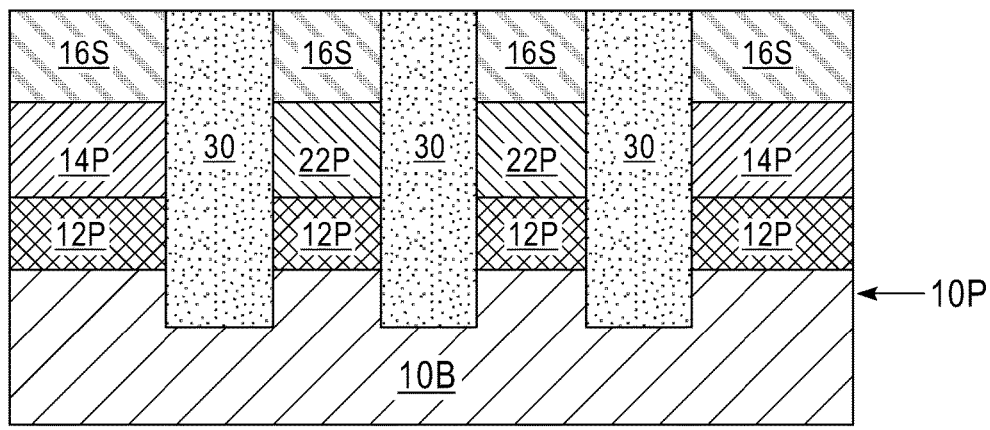
FIG. 6B is a cross sectional view of the exemplary semiconductor structure of FIG. 5B after forming a trench dielectric material plug within each trench isolation opening.

Referring now to FIGS. 6A-6B, there are illustrated the exemplary semiconductor structures of FIG. 5A and FIG. 5B, respectively, after forming a trench dielectric material plug 30 within each trench isolation opening 28. The trench dielectric material plug 30 comprises any well known trench dielectric material such as, for example, a trench dielectric oxide including silicon dioxide. The dielectric material plug 30 can be formed by first removing each another hard mask material portion 26P from the structure utilizing a planarization process such as, for example, chemical mechanical polishing or grinding. Next, the trench dielectric material is deposited so to at least fill each trench isolation opening 28 utilizing any deposition process such as, for example, chemical vapor deposition or plasma enhanced chemical vapor deposition. Following the deposition of the trench dielectric material, a planarization process such as, for example, chemical mechanical polishing and/or grinding, or an etch back process can be used to remove any portion of the trench dielectric material that is formed outside of each of the trench isolation openings 28 and to provide the exemplary semiconductor structure shown in FIG. 6A or FIG. 6B.

Figure 7A:
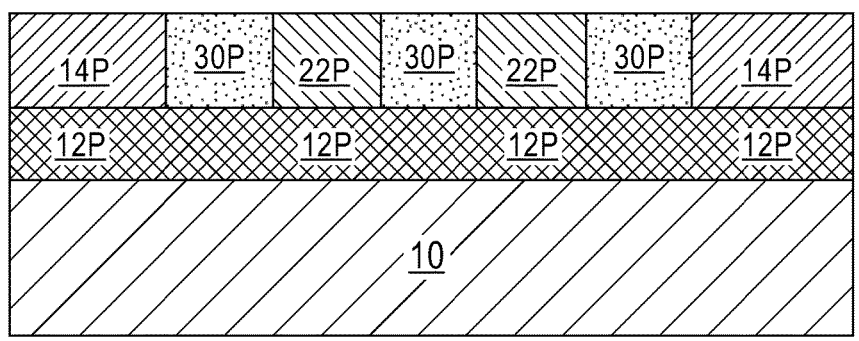
FIG. 7A is a cross sectional view of the exemplary semiconductor structure of FIG. 6A after removing an upper portion of each trench dielectric material plug and each hard mask material portion.
Figure 7B:
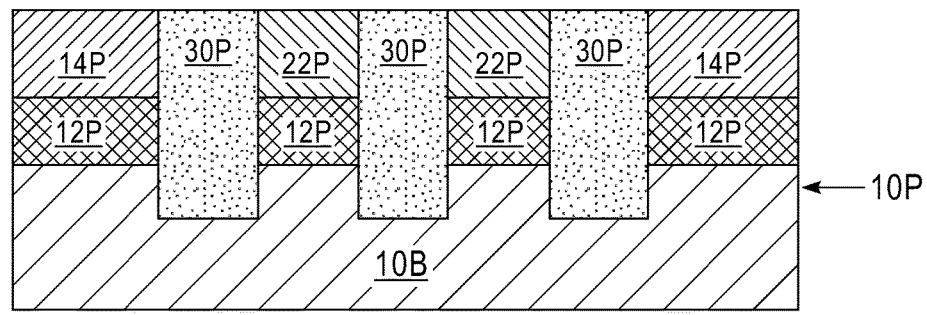
FIG. 7B is a cross sectional view of the exemplary semiconductor structure of FIG. 6B after removing an upper portion of each trench dielectric material plug and each hard mask material portion.

Referring now to FIGS. 7A-7B, there are illustrated the exemplary semiconductor structures of FIGS. 6A-6B, respectively, after removing an upper portion of each trench dielectric material plug 30 and each hard mask material structure 16S. The removal of the upper portion of the trench dielectric material plug 30 can be performed utilizing an etch back process that is selective in removing the trench dielectric material. Following the removal of the upper portion of the trench dielectric material plug 30, a portion of the trench dielectric material plug remains. Each remaining portion of the dielectric material plug 30 can be referred to herein as a trench isolation structure 30P. Following removal of the upper portion of the trench dielectric material plug 30, each hard mask material structure 16S is removed utilizing any well known material removal process such as, for example, chemical mechanical polishing or etching. In some embodiments, the upper portion of each trench dielectric material plug 30, and each hard mask material structure 16S can be removed at the same time utilizing a single material removal process.

FIGS. 7A-7B illustrate exemplary semiconductor structures including germanium-containing material portions 14P and III-V compound semiconductor material portions 22P that are present on a same substrate. In the exemplary semiconductor structure of FIG. 7A, each germanium-containing material portion 14P and III-V compound semiconductor material portion 22P extends upward from insulator layer 12. In the exemplary semiconductor structure of FIG. 7B, each germanium-containing material portion 14P and III-V compound semiconductor material portion 22P extends upward from an insulator material portion 12P. In either instance, a trench isolation structure 30P is located between each germanium-containing material portion 14P and each III-V compound semiconductor material portion 22P.

Figure 8A:
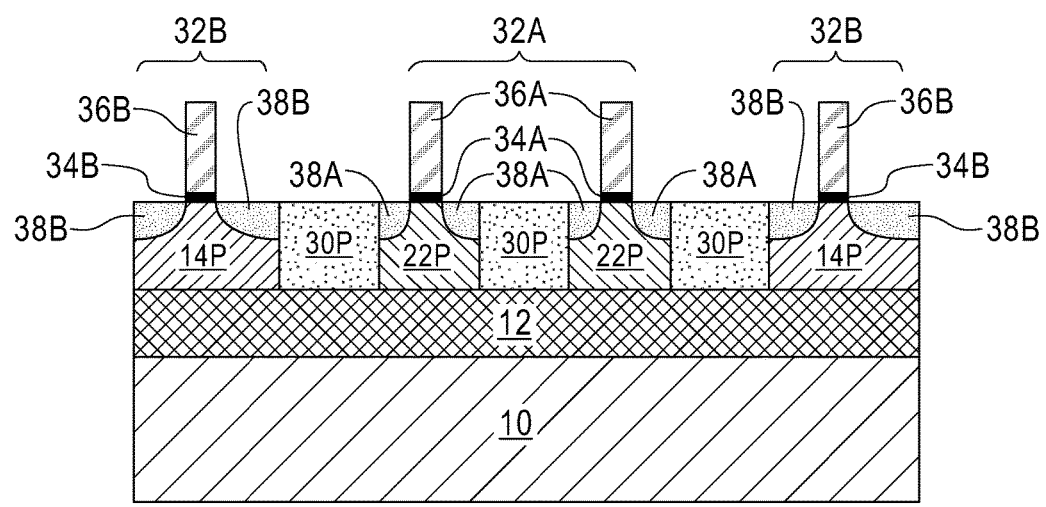
FIG. 8A is a cross sectional view of the exemplary semiconductor structure of FIG. 7A after forming a first functional gate structure on each remaining portion of the III-V compound semiconductor material, and forming a second functional gate structure on each remaining portion of the germanium-containing layer.

Referring now to FIG. 8A, there is illustrated the exemplary semiconductor structure of FIG. 7A after forming a first functional gate structure 32A on each remaining portion of the III-V compound semiconductor material (i.e., each III-V compound semiconductor material portion 22P), and forming a second functional gate structure 32B on each remaining portion of germanium-containing layer (i.e., each germanium-containing material portion 14P).

By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion (34A, 34B) and a gate conductor portion (36A, 36B). In some embodiments, a gate cap portion (not shown) can be present atop the gate conductor portion (36A, 36B). Element 34A is a first gate dielectric portion, element 34B is a second gate dielectric portion, element 36A is a first gate conductor portion, and element 36B is a second gate conductor portion.

Each gate dielectric portion (34A, 34B) comprises a gate dielectric material. The gate dielectric material that provides each gate dielectric portion (34A, 34B) can be an oxide, nitride, and/or oxynitride. In one example, the gate dielectric material that provides each gate dielectric portion (34A, 34B) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as each gate dielectric portion 34A, 34B. In some embodiments, the first gate dielectric portion 34A comprises a same gate dielectric material as second gate dielectric portion 34B. In other embodiments, the first gate dielectric portion 34A comprises a different gate dielectric material than the second gate dielectric portion 34B.

The gate dielectric material used in providing each gate dielectric portion (34A, 34B) can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric material are used in providing the first and second gate dielectric portions (34A, 34B), block mask technology can be used. In one embodiment of the present application, the gate dielectric material used in providing each gate dielectric portion (34A, 34B) can have a thickness in a range from 1 nm to 10 nm. Other thicknesses that are lesser than, or greater than, the aforementioned thickness range can also be employed for the gate dielectric material.

Each gate conductor portion (36A, 36B) comprises a gate conductor material. The gate conductor material used in providing each gate conductor portion (36A, 36B) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the first gate conductor portion 36A may comprise a same gate conductor material as the second gate conductor portion 36B. In other embodiments, the first gate conductor portion 36A comprises a different gate conductor material than the second gate dielectric portion 36B. For example, the first gate conductor portion 36A may comprise an nFET gate metal, while the second gate conductor portion 36B may comprise a pFET gate metal.

The gate conductor material used in providing each gate conductor portion (36A, 36B) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions (36A, 36B), block mask technology can be used. In one embodiment, the gate conductor material used in providing each gate conductor portion (36A, 36B) has a thickness from 1 nm to 100 nm. Other thicknesses that are lesser than, or greater than, the aforementioned thickness range can also be employed for the gate conductor material used in providing each gate conductor portion (36A, 36B).

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (32A, 32B) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, sacrificial gate structures are first provided instead of functional gate structures. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (38A, 38B) can be formed by introducing an n-type or a p-type dopant into each germanium-containing material portion 14P and into each III-V compound semiconductor material portion 22P utilizing any well known ion implantation process. Element 38A represents a source/drain region for each first functional gate structure 32A, while element 38B represents a source/drain region for each second functional gate structure 32B. In the embodiment illustrated in FIG. 8A, the first and second source/drain regions (38A, 38B) do not extend to the topmost surface of the insulator layer 12.

In some embodiments, and prior to formation of the source/drain regions, a gate spacer (not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

Figure 8B:
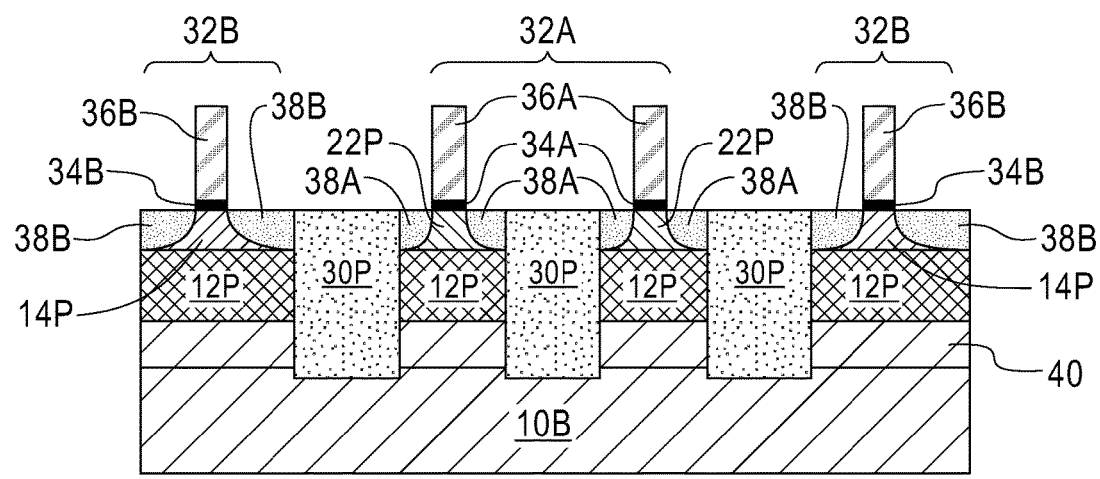
FIG. 8B is a cross sectional view of an exemplary semiconductor structure similar to that shown in FIG. 7B after forming a first functional gate structure on each remaining portion of the III-V compound semiconductor material, and forming a second functional gate structure on each remaining portion of the germanium-containing layer.

Referring now to FIG. 8B, there is illustrated an exemplary semiconductor structure similar to that shown in FIG. 7A (except that in this embodiment, each germanium-containing material portion 14P and each III-V compound material portion 22P has a thickness that is less than that shown in FIG. 7A) after forming a first functional gate structure 32A on each remaining portion of the III-V compound semiconductor material (i.e., each III-V compound semiconductor material portion 22P), and forming a second functional gate structure 32B on each remaining portion of germanium-containing layer (i.e., each germanium-containing material portion 14P). The various materials and processing mentioned above in providing the first and second functional gate structures (32A, 32B) as shown in FIG. 8A can be used in providing the first and second functional gate structures (32A, 32B) in this embodiment of the present application. In the embodiment illustrated in FIG. 8B, the first and second source/drain regions (38A, 38B) extend to the topmost surface of an underlying insulator material portion 12P. Also, and for the exemplary semiconductor structure shown in FIG. 8B, semiconductor back gate pedestal portions 40 can be formed in the previously provided pedestal portions 10P of the handle substrate by applying a back gate basis to the structure. The semiconductor back gate pedestal portions 40 can be formed by providing a dopant within the pedestal portion 10P of the handle substrate 10. The dopant can be provided by ion implantation, followed by a dopant activation anneal (i.e., laser annealing, rapid thermal annealing and/or furnace annealing). The semiconductor back gate pedestal portions 40 can include an n-type dopant (such as, for example, phosphorus, arsenic and/or antimony) or a p-type dopant (such as, for example, boron, gallium and/or indium). The doping that provides the semiconductor back gate pedestal portions 40 can be formed at any step of the present application. For example, doping of the handle substrate 10 can be performed prior to providing the exemplary semiconductor structure shown in FIG. 2 or after providing the exemplary semiconductor structure shown in FIG. 6B or 7B.

Figure 9:
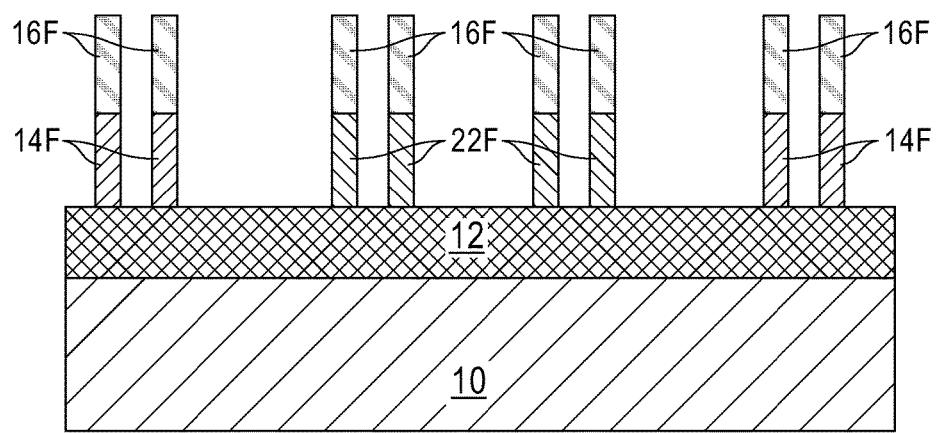
FIG. 9 is a cross sectional view of the exemplary semiconductor structure shown in FIG. 4 after performing a patterning process that provides a plurality of hard mask capped III-V compound semiconductor fins and a plurality of hard mask capped germanium-containing fins in accordance with another embodiment of the present application.

Referring now to FIG. 9, there is illustrated the exemplary semiconductor structure shown in FIG. 4 after performing a patterning process that provides a plurality of hard mask capped III-V compound semiconductor fins (16F/22F) and a plurality of hard mask capped germanium-containing fins (16F/14F) in accordance with an embodiment of the present application. In the drawings, element 16F represents a hard mask cap that is formed from a remaining portion of each hard mask material portion 16P, element 22F represents a III-V compound semiconductor fin 22F that includes a remaining portion of the III-V compound semiconductor material 22, and element 14F represents a germanium-containing fin 14F that includes a remaining portion of the germanium-containing material portion 14P. The patterning process used to define each semiconductor fin (14F, 22F) removes the entirety of each defect-containing region 24 and, if present, the overgrowth region 22T.

In one embodiment of the present application, the patterning process comprises a sidewall image transfer (SIT) process. The SIT process includes forming a contiguous mandrel material layer (not shown) over the exemplary semiconductor structure shown in FIG. 4. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material layers. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to provide the exemplary semiconductor structure shown in FIG. 9 may include lithography and etching as defined above.

Each germanium-containing fin 14F and each III-V compound semiconductor fin 22F that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each germanium-containing fin 14F and each III-V compound semiconductor fin 22F that is formed has a height from 10 nm to 100 nm, and a width from 5 nm to 30 nm. Other heights and widths that are lesser than, or greater than, the aforementioned ranges may also be used in the present application for each germanium-containing fin 14F and each III-V compound semiconductor fin 22F.

Figure 10:
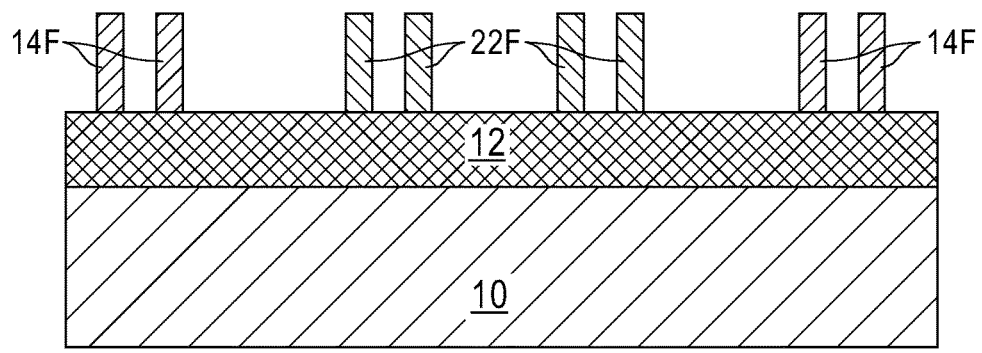
FIG. 10 is a cross sectional view of the exemplary semiconductor structure of FIG. 9 after removing the hard mask cap from atop each III-V compound semiconductor fin and atop each germanium-containing fin.

Referring now to FIG. 10, there is illustrated the exemplary semiconductor structure of FIG. 9 after removing the hard mask cap 16F from atop each III-V compound semiconductor fin 22F and atop each germanium-containing fin 14F. Each hard mask cap 16F can be removed utilizing a planarization process such as, for example, chemical mechanical planarization and/or grinding. In some embodiments, each hard mask cap 16F may remain atop each of the different fins (14F, 22F).

Figure 11:
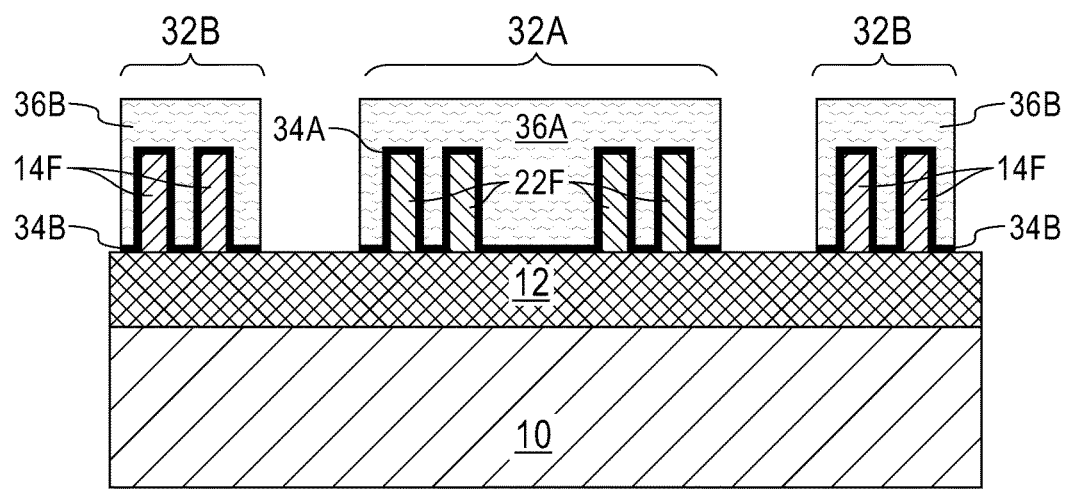
FIG. 11 is a cross sectional view of the exemplary semiconductor structure of FIG. 10 after forming a first functional gate structure straddling over each III-V compound semiconductor fin, and forming a second functional gate structure straddling over each germanium-containing fin.

Referring now to FIG. 11, there is illustrated the exemplary semiconductor structure of FIG. 10 after forming a first functional gate structure 32A straddling over each III-V compound semiconductor fin 22F, and forming a second functional gate structure 32B straddling over each germanium-containing fin 14F. The term "straddle over" denotes that the functional gate structure spans over each semiconductor fin such that one portion of the functional gate structure is located on one side of the each semiconductor fin (14F or 22F) and another portion of the function gate structure is located on another side of each semiconductor fin (14F or 22F). The various materials and processing mentioned above in providing the first and second functional gate structures (32A, 32B) as shown in FIG. 8A can be used in providing the first and second functional gate structures (32A, 32B) in this embodiment of the present application. In this embodiment, it is also possible to form sacrificial gate structures prior to forming the first functional gate structure 32A and/or the second functional gate structure 32B.

After forming the gate structure (functional and/or sacrificial gate structure) source/drain regions (not shown) can be formed utilizing an epitaxial growth process from exposed portions of each of the semiconductor fins (14F and 22F) that are not protected by the gate structure; the source/drain regions would by located within a plane that runs into and out of the drawing illustrated in FIG. 11. The source/drain regions may comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor base substrate having semiconductor back gate pedestal portions extending upwards from a semiconductor material surface of the semiconductor base substrate, wherein the semiconductor back gate pedestal portions are in direct physical contact with the semiconductor material surface of the semiconductor base substrate:
   an insulator layer portion located on each semiconductor back gate pedestal portion;
   III-V compound semiconductor material portions located on a first set of the insulator layer portions; and
   germanium-containing material portions located on a second set of the insulator layer portions, wherein a trench isolation structure is present between each III-V compound semiconductor material portion and each germanium-containing material portion.

2. The semiconductor structure of claim 1, wherein the germanium-containing material portions and the III-V compound semiconductor material portions have a same height.

3. The semiconductor structure of claim 2, wherein the germanium-containing material portions and the III-V compound semiconductor material portions are fins.

4. The semiconductor structure of claim 1, further comprising a first functional gate structure contacting a surface of each of the III-V compound semiconductor material portions, and a second functional gate structure containing a surface of each of the germanium-containing material portions.

5. The semiconductor structure of claim 1, wherein the III-V compound semiconductor material portions have an epitaxial relationship with sidewall surfaces of the germanium-containing material portions.

6. The semiconductor structure of claim 1, wherein each insulator layer portion has sidewall surfaces that are vertically aligned with sidewall surfaces of one of the semiconductor back gate pedestal portions that is present beneath the insulator layer portion.

7. The semiconductor structure of claim 1, wherein each semiconductor back gate pedestal portion contains an n-type dopant.

8. The semiconductor structure of claim 1, wherein each semiconductor back gate pedestal portion contains a p-type dopant.

9. The semiconductor structure of claim 1, wherein the semiconductor base substrate and the semiconductor back gate pedestals comprise a same semiconductor material.

10. The semiconductor structure of claim 1, further comprising a trench isolation structure located between each neighboring pair of insulator layer portions and semiconductor back gate pedestal portions, wherein each trench isolation structure extends into a portion of the semiconductor base substrate.

11. The semiconductor structure of claim 10, wherein each trench isolation structure has a topmost surface that is coplanar with a topmost surface of each of the III-V compound semiconductor material portions and each of the germanium-containing material portions.

12. The semiconductor structure of claim 10, wherein each trench isolation structure has a topmost surface that is vertically offset and located beneath a topmost surface of each of the III-V compound semiconductor material portions and each of the germanium-containing material portions.

13. The semiconductor structure of claim 1, wherein each of the germanium-containing material portions comprises an unalloyed germanium.

14. The semiconductor structure of claim 1, wherein each of the germanium-containing material portions comprise a silicon germanium alloy.

15. The semiconductor structure of claim 14, wherein the silicon germanium alloy is relaxed.

16. The semiconductor structure of claim 14, wherein the silicon germanium alloy contains from 25 atomic percent to 75 atomic percent germanium.

17. The semiconductor structure of claim 1, wherein each of the germanium-containing material portions has a thickness that is less than a critical thickness of a particular silicon germanium alloy.

18. The semiconductor structure of claim 1, wherein a source region and a drain region are present in each of the germanium-containing material portions and the III-V compound semiconductor material portions.

* * * * *